United States Patent
Tsai et al.

(10) Patent No.: US 6,977,436 B2
(45) Date of Patent: Dec. 20, 2005

(54) SEMICONDUCTOR PACKAGING DEVICE

(75) Inventors: Chen-Jung Tsai, Hsin-Chu (TW); Jui-Chung Lee, Yun-Lin (TW); Chih-Wen Lin, Hsin-Chu (TW)

(73) Assignee: Macronix International Co. Ltd., Hsin-chu (TW)

(*) Notice: Subject to any disclaimer, the term of this patent is extended or adjusted under 35 U.S.C. 154(b) by 79 days.

(21) Appl. No.: 10/074,052

(22) Filed: Feb. 14, 2002

(65) Prior Publication Data

US 2003/0151143 A1 Aug. 14, 2003

(51) Int. Cl.[7] .............................................. H01L 23/48
(52) U.S. Cl. ..................... 257/738; 257/778; 174/260; 174/255
(58) Field of Search ................ 174/52.1, 260, 174/255; 361/795; 257/668, 737, 778, 688, 704, 797, 738, 780

(56) References Cited

U.S. PATENT DOCUMENTS

| | | | |
|---|---|---|---|
| 5,409,865 A | | 4/1995 | Karnezos |
| 5,650,918 A | * | 7/1997 | Suzuki .................... 361/760 |
| 5,814,883 A | * | 9/1998 | Sawai et al. ............. 257/712 |
| 5,861,670 A | * | 1/1999 | Akasaki .................. 257/737 |
| 5,939,782 A | * | 8/1999 | Malladi .................. 257/698 |
| 6,031,284 A | * | 2/2000 | Song ..................... 257/701 |
| 6,175,160 B1 | * | 1/2001 | Paniccia et al. ......... 257/778 |
| 6,183,592 B1 | * | 2/2001 | Sylvester ................ 156/299 |
| 6,248,951 B1 | * | 6/2001 | Murali et al. ........... 174/52.2 |
| 6,326,244 B1 | | 12/2001 | Brooks et al. |
| 6,359,235 B1 | * | 3/2002 | Hayashi ................. 174/260 |
| 6,365,833 B1 | * | 4/2002 | Eng et al. .............. 174/52.2 |
| 6,424,050 B1 | * | 7/2002 | Komiyama .............. 257/777 |
| 6,441,499 B1 | * | 8/2002 | Nagarajan et al. ...... 257/780 |
| 6,469,897 B2 | * | 10/2002 | Ho et al. ............... 361/704 |
| 6,472,762 B1 | * | 10/2002 | Kutlu ................... 257/778 |
| 6,506,980 B2 | * | 1/2003 | Hashimoto .............. 174/261 |
| 6,509,531 B2 | * | 1/2003 | Sakai et al. ............ 174/264 |
| 6,509,642 B1 | * | 1/2003 | Cohn ..................... 257/712 |

* cited by examiner

*Primary Examiner*—David A. Zarneke

(57) ABSTRACT

A semiconductor packaging device has a carrier having at least a portion configured for containing a chip. The chip, affixing to the portion with sidewall, has a back surface an active surface, which multitudes of bonding pads are on the active surface. One insulating layer on the active surface and carrier has multitudes of conductive holes corresponding to the first bonding pads. A multi-layer structure on the insulating layer is configured for providing electrical connection to the conductive holes. Another insulating layer, affixed on one of the carrier and the multi-layer structure, has another conductive holes electrically connected to the conductive holes. Multitudes of solder balls, on at least one of the carrier and latter insulating layer, electrically connect the latter conductive holes.

23 Claims, 5 Drawing Sheets

SEMICONDUCTOR PACKAGING DEVICE

BACKGROUND OF THE INVENTION

1. Field of the Invention

The invention relates to a stacking semiconductor packaging device and manufacture thereof, and more particularly relates to a semiconductor packing device with a carrier for chip.

2. Description of the Prior Art

In packaging manufacture, especially in packaging manufacture of FCBGA for integrated circuits (ICs) of high-density I/O or few I/O on small area, the bonding pads on ICs need to be rearranged for an array by a redistribution process, followed by the formation of under-bumping-metallization layer and solder bumps. Due to the limitation of general print circuit board (PCB) on the high-density I/O layout of integrated circuits, a flip chip is first affixed to a build-up substrate, followed by fanning-out the I/O pins of the flip chip to become great-pitch-distribution area.

However, due to the small solder bumps on the flip chips and the difference of thermal expansion between the solder bumps and the BT substrate, it is necessary to fill the gaps among the flip chip, solder bumps, and a general substrate with underfilled gel on consideration of reliability. Thus, the consumptions of time and cost for such a process are high.

SUMMARY OF THE INVENTION

It is one object of the present invention to provide a semiconductor packaging and manufacture thereof. An additionally high-cost fan-out process and thereto relative steps are not necessary for the present invention.

It is another object of the present invention to provide improved structure of FCBGA and manufacture thereof. The redistribution and solder-bump process for a conventional structure of FCBGA are simplified and integrated into the fan-out process of build-up substrate.

It is further object of the present invention to provide a novel packaging structure with improved reliability and manufacture thereof. A chip is prevented from affixing to a PCB directly such that a thickness of the novel packing structure is minimum and met with the requirement of heat radiation.

A semiconductor packaging device provides a carrier having at least a portion configured for containing a chip. The chip, affixing to the portion with sidewall, has a back surface an active surface, which multitudes of bonding pads are on the active surface. One insulating layer on the active surface and carrier has multitudes of conductive holes corresponding to the first bonding pads. A multi-layer structure on the insulating layer is configured for providing electrical connection to the conductive holes. Another insulating layer, affixed on one of the carrier and the multi-layer structure, has another conductive holes electrically connected to the conductive holes. Multitudes of solder balls, on at least one of the carrier and latter insulating layer, electrically connect the latter conductive holes. Such architechture integrates the redistribution and fan-out process, which simplifies the conventional process for flip-chip ball grid array.

BRIEF DESCRIPTION OF THE DRAWINGS

A better understanding of the invention may be derived by reading the following detailed description with reference to the accompanying drawings wherein.

DESCRIPTION OF THE PREFERRED EMBODIMENT

While the invention is described in terms of a single preferred embodiment, those skilled in the art will recognize that many devices described below can be altered as well as other substitutions with same function and can be freely made without departing from the spirit and scope of the invention.

Furthermore, there is shown a representative portion of semiconductor packaging of the present invention in enlarged. The drawings are not necessarily to scale for clarify of illustration and should not be interpreted in a limiting sense. Furthermore, the present invention can be applied on various multichip devices or packages.

A semiconductor packaging device provides a carrier having at least a portion configured for containing a chip. The chip, affixing to the portion with sidewall, has a back surface an active surface, which multitudes of bonding pads are on the active surface. One insulating layer on the active surface and carrier has multitudes of conductive holes corresponding to the first bonding pads. A multi-layer structure on the insulating layer is configured for providing electrical connection to the conductive holes. Another insulating layer, affixed on one of the carrier and the multi-layer structure, has another conductive holes electrically connected to the conductive holes. Multitudes of solder balls, on at least one of the carrier and latter insulating layer, electrically connect the latter conductive holes.

Figure 1:
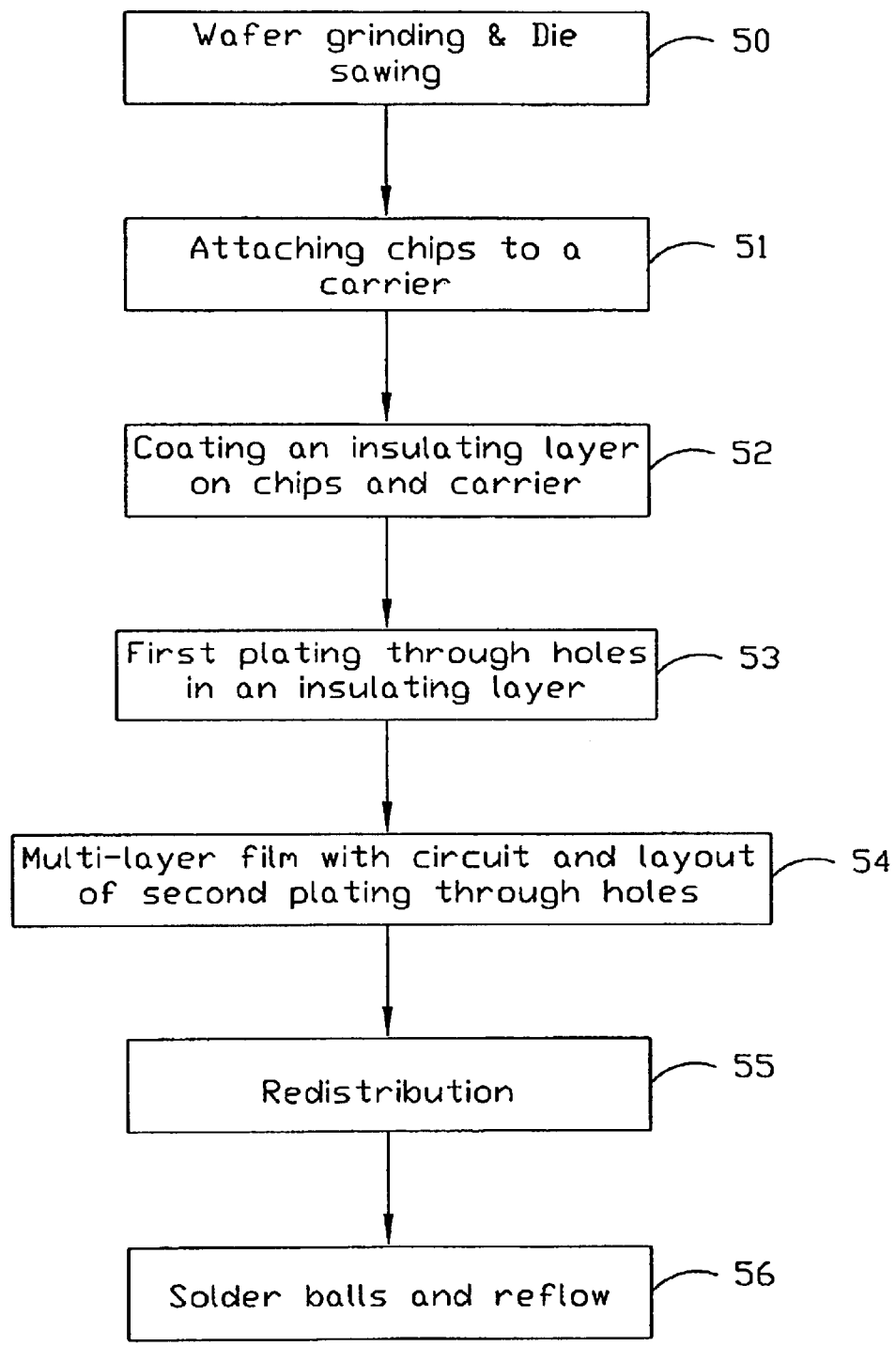
FIG. 1 is a flow chart illustrating the manufacture process in accordance with the present invention.

FIG. 1 is a flow chart illustrating the manufacture process in accordance with the present invention. One embodiment of the present invention is a manufacture process of FCBGA. A wafer is first grinded and the dies (chips) on the grinded wafer are sawed (step 50). The chips are attached to a carrier having multitudes of cavities or slots (step 51), wherein the active surfaces of the chips are faced upwards and the back surfaces/sidewalls of the chips are affixed to the cavities with adhesive. Furthermore, the carrier can be made of silicon, ceramic, glass, or organic substrate, and so on. Next, an insulating layer is coated on the active surfaces of the chips and the surface of the carrier, and thereafter multitudes of bonding pads on the surroundings of the active surfaces are exposed (step 52). The coating of the insulating layer can be implemented by conventional process of semiconductor film. And the insulating layer provides protection and planarization for the chips and the carrier. Furthermore, multitudes of first conductive via holes (plating through holes) are made in the insulating layer (step 53), wherein the first conductive holes are located corresponding to the bonding pads on the chip.

A layout for second conductive via holes and a multi-layer circuit are implemented on the insulating layer (step 54). The multi-layer circuit connects electrically the first via holes with the second via holes. Next, the re-distribution is implemented (step 55), wherein those re-distributed bonding pads are located corresponding to the second conductive via holes and aligned to a great-pitch array on a substrate. It can be implemented by conventional redistribution process and the process of under bump metalliztation. That is, a single/multi-layer film with predetermined circuit and plating through holes is used to adhered to the adhesive on the chips and the carrier, wherein the plating through holes are connected to the bonding pads of the chip. Then another adhesive is coated on the single/multi-layer film and the pads of the plating through holes are exposed. Next, the packaging chips are grinded and sawed followed by attaching multitudes of solder balls to the predetermined location (the locations of re-distributed pads and the second via holes) and reflow (step 56). The attachment of the solder balls can be implemented by conventional methods for ball grid array. Furthermore, the chips and the carriers can be grinded to a predetermined packaging thickness.

Figure 2:
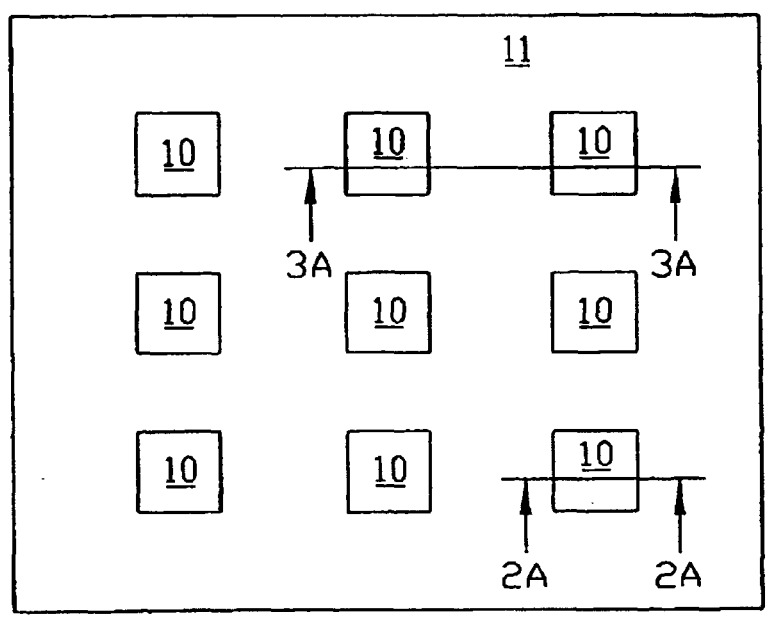
FIG. 2 is a plane view illustrating the arrangement of the chips and the carrier in accordance with the present invention.

FIG. 2 is a plane view illustrating the arrangement of the chips and the carrier in accordance with the present invention. Depicted in FIG. 2, there are multitudes of cavities 10 (or slots) on the carrier 11, in which each one is fitted for one chip. The back surfaces of the chips are affixed to the bottoms of the cavities with adhesive, as well as the sidewalls of the chips to the sidewalls of the cavities.

Figure 3:
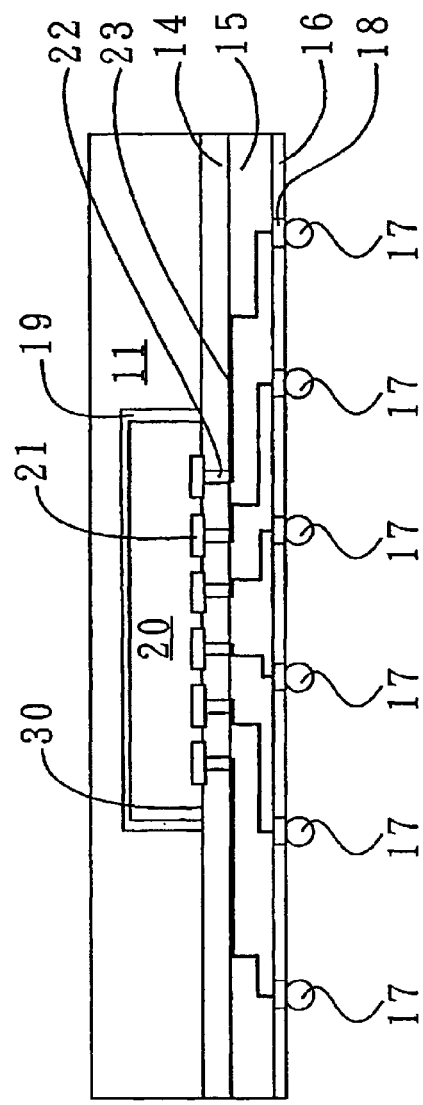
FIG.3 is a cross-sectional schematic diagram illustrating the packaging chip cut with line 2A—2A in FIG. 2.
Figure 4:
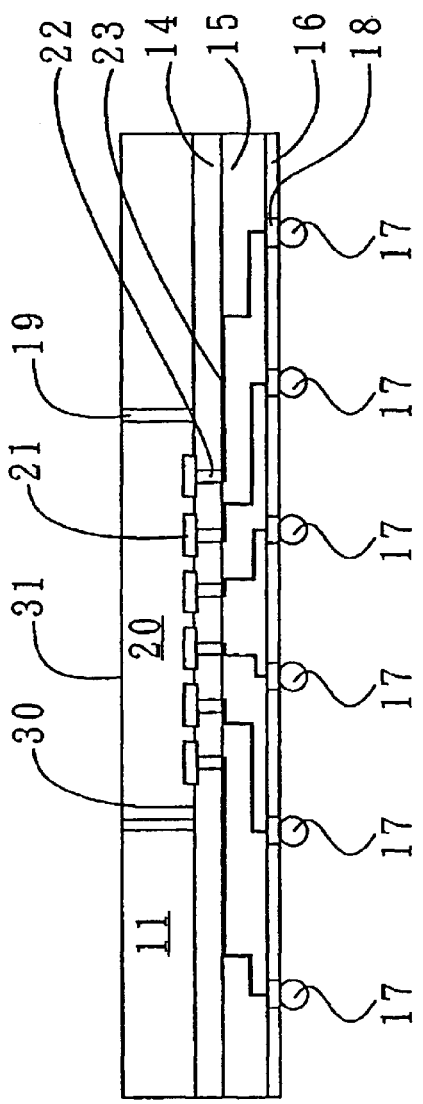
FIG.4 is a cross-sectional schematic diagrams illustrating the packaging chip cut with line 2A—2A in FIG. 2.
Figure 5:
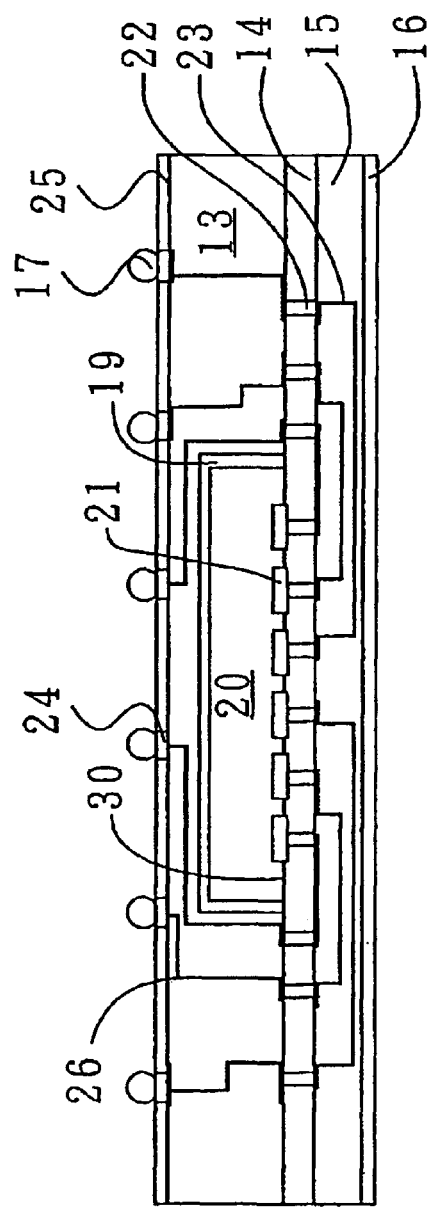
FIG.5 is a cross-sectional schematic diagram illustrating the packaging chip cut with line 2A—2A in FIG. 2.

FIGS. 3–5 are cross-sectional views illustrating the packaging chip cut with line 2A—2A of FIG. 2. Depicted in FIG. 3, solder balls are distributed on the surrounding of the chip. After the chip 20 is placed in the carrier 11 and affixed by an adhesive 19, an insulating layer 14 is formed on the active surface 30 of the chip 20 and the carrier 11 where the bonding pads 21 of the chip 20 are exposed. Multitudes of plating through 22 in the insulating layer 14 are corresponding and electrically connected to the bonding pads 21. A multi-layer film 15 with predetermined circuit 23 and plating through holes 40 is on the insulating layer 14 and thereafter another insulating layer 16 is formed on the multi-layer film 15 only to expose the pads 18 of the plating through holes 40 on which the solder balls 17 are affixed, and the solder balls are distributed on the carrier 11, the chip 20, or both. Thus, the pad redistribution, bumping, and fan-out processes for the chips can be implemented at same process. One of advantages of the present invention is to avoid the direct chip attachment to a print circuit board for fear of poor reliability. Furthermore, the packaging thickness is minimum and the heat radiation is improved.

Shown in FIG. 4 similar to FIG. 3, the thickness of a carrier 13 is almost equal to one of the chip 20 such that the back surface 31 of the chip 20 is exposed and only the sidewall of the chip 20 is affixed to the carrier 13.

Depicted 5, in addition to the back surface 31 of the chip 20 in the cavity of the carrier 13, the carrier 13 could comprise predetermined circuit layout 26, and solder pads 24 (exposed by an insulating layer 25), when the carrier 13 is made of organic material. The active surface 30 of the chip 20 is connected electrically to the conductive via predetermined circuit 26 of the carrier 13 through the circuit layout 23 of the multi-layer film 15 and the plating through holes 22 in the insulating layer 14. Multitudes of solder balls 17 are affixed to the solder pads 24 of the carrier 13.

Figure 6:
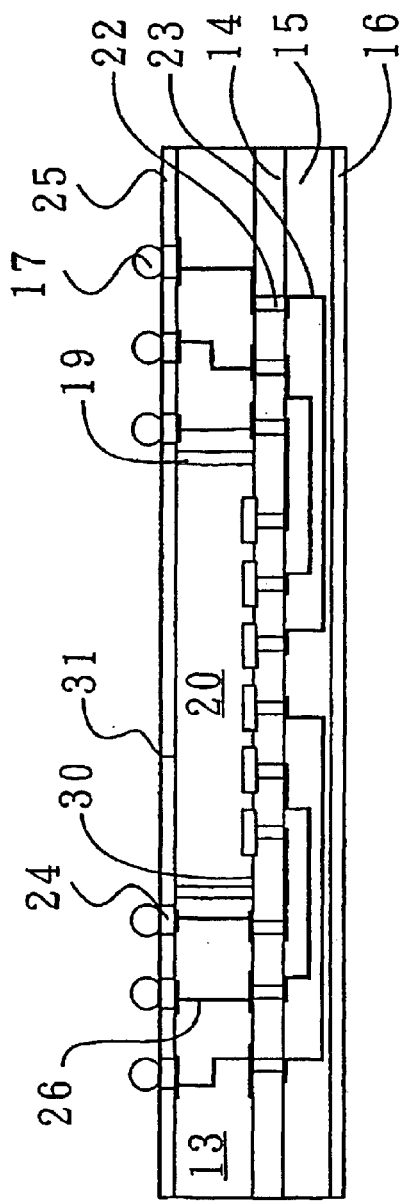
FIG.6 is a cross-sectional schematic diagram illustrating the packaging chip cut with line 2A—2A in FIG. 2.

FIG. 6 is a cross-sectional view illustrating the packaging chip cut with line 2A—2A in FIG. 2. Beside of the equal thickness of the chip 20 and the carrier 13, the carrier 13 is made of an organic material so as to have the predetermined circuit 26 therein and solder pads 24 thereon. The active surface 30 of the chip 20 are connected to the solder pads 24 of the carrier 13 through the multi-layer film 15. The solder balls 17 are affixed to the solder pads 24 on the carrier 13 surrounding the back surface 31 of the chip.

Figure 7:
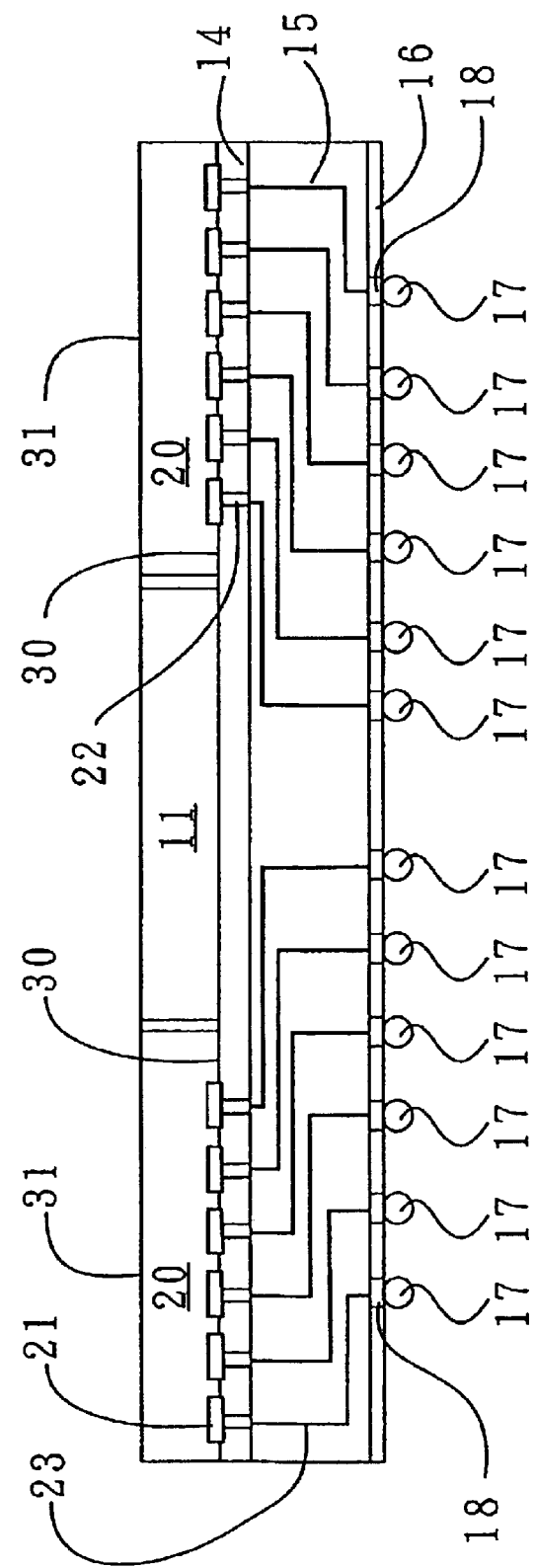
FIG.7 is a cross-sectional schematic diagram illustrating the packaging chip cut with line 3A—3A in FIG. 2.

FIG. 7 is a cross-sectional view illustrating the packaging chip cut with line 3A—3A in FIG. 2. In this embodiment, the thickness of the carrier 11 is equal to that of the chip 20. Two chips 20 are affixed to the sidewall of the carrier 11 with their individual sidewall, and exposed their individual back surface 31 out. One of advantages in the embodiment, the two chips 20 can have electric interconnection through the multi-layer film 15 with its predetermined circuit. To be specific, the carrier 11 in the embodiment is also made of the organic material that can have predetermined layout. The solder balls 17 are distributed on the carrier 11 that is at the same side with the back surface 31 of the chip 20.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor packaging device comprising:
   a carrier having at least a cavity thereon, said cavity configured for fitting a chip;
   said chip having a back surface, an active surface, and a sidewall connecting said back surface and said active surface, wherein said active surface has a plurality of first bonding pads;
   an adhesive affixing said back surface and said sidewall to said cavity;
   a first insulating layer coated on said active surface and said carrier and having a plurality of first conductive holes therein, wherein said first conductive holes correspond to first bonding pads;
   a multi-layer structure on said first insulating layer, said multi-layer structure having a plurality of conductive layout lines, a plurality of second conductive holes therein, a second insulating layer thereon, and a plurality of exposed ball pads in said second insulating layer, wherein said first conductive holes are electrically connected with said conductive layout lines, said second conductive holes, and said exposed ball pads; and
   a plurality of solder balls affixed to said exposed ball pads.

2. A semiconductor packaging device comprising;
   a carrier having at least a portion configured for containing a chip;
   at least a chip having a back surface and an active surface, and a sidewall connecting said back surface and said, wherein said sidewall is affixed to said portion and a plurality of first bonding pads on said active surface are exposed;
   a first insulating layer on said active surface and said carrier, wherein a plurality of first conductive holes in said first insulating layer are corresponding to said first bonding pads;
   a multi-layer structure on said first insulating layer, said multi-layer structure configured for providing electrical connection to said first conductive holes;
   a second insulating layer affixed on one of said carrier and said multi-layer structure, wherein said second insulating layer has a plurality of second conductive holes electrically connected to said first conductive holes; and a plurality of solder balls on at least one of said carrier and said second insulating layer, wherein said solder balls electrically connected said second conductive holes.

3. The semiconductor packaging device of claim 2, wherein said carrier is further configured for providing electrical connection between said second conductive holes and said first conductive holes when said second insulating layer is affixed on said carrier.

4. The semiconductor packaging device of claim 3, wherein said carrier has a plurality of third conductive holes therein.

5. The semiconductor packaging device of claim 2, wherein said back surface is affixed to said portion.

6. The semiconductor packaging device of claim 5, wherein said portion comprises a cavity.

7. The semiconductor packaging device of claim 2, wherein said portion is a cavity.

8. The semiconductor packaging device of claim 2, wherein said portion is a slot.

9. The semiconductor packaging device, comprising;
a carrier having at least a cavity thereon, said cavity configured for fitting a chip;
said chip having a back surface and an active surface, and a sidewall connecting said back surface and said active surface, wherein said back surface and said sidewall are affixed to said cavity and a plurality of first bonding pads on said active surface are exposed;
a first insulating layer on said active surface and said carrier, wherein a plurality of first conductive holes in said first insulating layer are corresponding to first bonding pads;
a multi-layer structure on said first insulating layer, wherein a plurality of second conductive holes in said conductive structure electrically connect said first bonding pads;
a second insulating layer on said multi-layer structure, wherein a plurality of ball pads on said second insulating layer electrically connect said second conductive holes; and
a plurality of solder balls affixed to said ball pads.

10. The semiconductor packaging device of claim 9, wherein said carrier is made of a material selected from groups consisting of a silicon substrate, a ceramic substrate, a glass substrate, an organic substrate, or combination of above.

11. The semiconductor packaging device of claim 9, wherein said ball pads are distributed at a location selected from the groups consisting of above said chip, above surrounding of said chip, and both above said chip and above surrounding of said chip.

12. A semiconductor packaging device, comprising:
a carrier having at least a slot therein configured for fitting a chip;
said chip having a back surface and an active surface, and a sidewall connecting said back surface and said active surface, wherein said sidewall is affixed to a sidewall of said slot and a plurality of first bonding pads on said active surface are exposed;
a first insulating layer on said active surface and said carrier, wherein a plurality of first conductive holes in said first insulating layer are corresponding to first bonding pads;
a multi-layer structure on said first insulating layer, wherein a plurality of second conductive holes in said conductive structure electrically connect said first bonding pads;

a second insulating layer on said back surface and said carrier, wherein a plurality of ball pads on said second insulating layer electrically connect said second conductive holes; and
a plurality of solder balls affixed to said ball pads.

13. The semiconductor packaging device of claim 12, wherein said carrier has a plurality of third conductive holes electrically connecting said second conductive holes and said ball pads.

14. The semiconductor packaging device of claim 12, wherein said solder balls are distributed around said chip.

15. The semiconductor packaging device of claim 12, wherein said solder balls and said back surface are on a same side.

16. A semiconductor packaging device, comprising:
a carrier having at least a cavity therein, said cavity configured for fitting a chip;
said chip having a back surface and an active surface, and a sidewall connecting said back surface and said active surface, wherein said back surface and said sidewall are affixed to said cavity and a plurality of first bonding pads on said active surface are exposed;
a first insulating layer on said active surface and said carrier, wherein a plurality of first conductive holes in said first insulating layer are corresponding to first bonding pads;
a multi-layer structure on said first insulating layer, wherein a plurality of second conductive holes in said conductive structure electrically connect said first bonding pads;
a second insulating layer, at a same side with said back surface, affixed to said carrier, wherein a plurality of ball pads on said second insulating layer electrically connect said second conductive holes; and
a plurality of solder balls affixed to said ball pads.

17. The semiconductor packaging device of claim 16, wherein said ball pads are distributed at a location selected from the groups consisting of above said chip, above surrounding of said chip, and both above said chip and above surrounding of said chip.

18. A semiconductor packaging device, comprising:
a carrier having at least a slot therein configured for fitting a chip;
said chip having a back surface and an active surface, and a sidewall connecting said back surface and said active surface, wherein said sidewall affixes to said slot and a plurality of first bonding pads on said active surface are exposed;
a first insulating layer on said active surface and said carrier, wherein a plurality of first conductive holes in said first insulating layer are corresponding to first bonding pads;
a multi-layer structure on said first insulating layer, wherein a plurality of second conductive holes in said conductive structure electrically connect said first bonding pads;
a second insulating layer affixed to multi-layer structure, wherein a plurality of ball pads on said second insulating layer electrically connect said second conductive holes; and
a plurality of solder balls affixed to said ball pads.

19. The semiconductor packaging device of claim 18, wherein said carrier is made of a material selected from groups consisting of a silicon substrate, a ceramic substrate, a glass substrate, an organic substrate, or combination of above.

20. The semiconductor packaging device of claim 18, wherein said ball pads are distributed at a location selected from the groups consisting of above said chip, above surrounding of said chip, and both above said chip and above surrounding of said chip.

21. A semiconductor packaging device comprising:

a carrier having at least a cavity thereon, said cavity configured for fitting a chip;

said chip having a back surface an active surface, and a sidewall connecting said back surface and said active surface, wherein said back surface and said sidewall are affixed to said cavity and exposed said active surface, and said active surface has a plurality of first bonding pads;

a first insulating layer coated on said active surface and said carrier and having a plurality of first conductive holes therein, wherein said first conductive holes correspond to first bonding pads;

a multi-layer structure on said first insulating layer, said multi-layer structure having a plurality of conductive layout lines, a plurality of second conductive holes therein, a second insulating layer thereon, and a plurality of exposed ball pads in said second insulating layer, wherein said first conductive holes are electrically connected with said conductive layout lines, said second conductive holes, and said exposed ball pads; and a plurality of solder balls affixed to said exposed ball pads.

22. The semiconductor packaging device of claim 21, wherein said carrier is made of a material selected from groups consisting of a silicon substrate, a ceramic substrate, a glass substrate, an organic substrate, or combination of above.

23. The semiconductor packaging device of claim 21, wherein said ball pads are distributed at a location selected from the groups consisting of above said chip, above surrounding of said chip, and both above said chip and above surrounding of said chip.

* * * * *